United States Patent [19]

Hongu et al.

[11] 4,132,952
[45] Jan. 2, 1979

[54] MULTI-BAND TUNER WITH FIXED BROADBAND INPUT FILTERS

[75] Inventors: Masayuki Hongu, Komae; Tsutomu Niimura, Hiratsuka; Hiromi Kawakami, Yokohama, all of Japan

[73] Assignee: Sony Corporation, Tokyo, Japan

[21] Appl. No.: 873,963

[22] Filed: Jan. 31, 1978

Related U.S. Application Data

[63] Continuation-in-part of Ser. No. 739,276, Nov. 5, 1976, abandoned.

[30] Foreign Application Priority Data

Nov. 11, 1975 [JP] Japan .............................. 50-135500

[51] Int. Cl.² ............................................. H04B 1/10
[52] U.S. Cl. .................................... 325/459; 325/437; 325/489
[58] Field of Search ............... 325/308, 344, 388, 427, 325/435–439, 453, 458, 459, 461, 489, 473, 477; 358/160, 167

[56] References Cited

U.S. PATENT DOCUMENTS

| | | | |
|---|---|---|---|
| 3,333,198 | 7/1967 | Mandell et al. | 325/308 |
| 3,414,821 | 12/1968 | Bickers et al. | 325/437 |
| 3,639,840 | 2/1972 | Shekel et al. | 325/437 |
| 3,942,120 | 3/1976 | Ham | 325/437 |

Primary Examiner—Robert L. Richardson
Assistant Examiner—Jin F. Ng
Attorney, Agent, or Firm—Lewis H. Eslinger; Alvin Sinderbrand

[57] ABSTRACT

A tuner for receiving signals broadcast on two spaced bands, each divided into several channels, has two fixed bandpass filters, one to pass all of the channels in the lower frequency band and the other to pass all of the channels in the higher frequency band. The tuner includes a mixer to which signals of either band are supplied by selective operation of a double-throw switch. A tunable local oscillator supplies a heterodyning signal to the mixer to convert any selected channel of the received signal to an intermediate frequency (i.f.) band chosen to avoid image interference from undesired channels, whether the local oscillator frequency is above or below the selected channel. To ease the constraints on the choice of the i.f. band, different i.f. filters tuned to first and second i.f. bands may be used for the higher and lower received bands. A second double-throw switch ganged with the first switch can then be used to direct the heterodyned signals to the proper i.f. filter.

7 Claims, 8 Drawing Figures

MULTI-BAND TUNER WITH FIXED BROADBAND INPUT FILTERS

BACKGROUND OF THE INVENTION

Field of the Invention

This is a continuation-in-part of application Ser. No. 739,276 filed Nov. 5, 1976, now abandoned.

This invention relates to a multi-band, multi-channel tuner comprising a pair of input filters each with a fixed relatively broad pass band to pass only channels in one of the bands, and switching means associated therewith to select the proper filter for the band containing a desired channel. In particular, the invention relates to such a tuner in which a local oscillator is arranged to convert the desired channel to an intermediate frequency band with minimal interference from other channels.

Description of the Prior Art

It has been customary in prior art television tuners for VHF channels to provide a tunable input filter between the antenna and a high frequency amplifier and another tunable filter between the high frequency amplifier and a mixer circuit. Such filters have heretofore been tunable, continuously or in discrete steps, to the desired channel to prevent signals from other channels from reaching the mixer. Each tuner has also included a tunable local oscillator to supply a heterodyning signal of the proper frequency to the mixer to convert the signal in the desired channel to an intermediate frequency band common to all channels of both received bands.

It has long been known that the heterodyning, or frequency conversion, of signals to an intermediate frequency band raises the possibility of a type of interference known as image interference from undesired signals having a specific frequency relationship to the desired signals. However, it is also well known that, if a high frequency input amplifier having filters tunable to pass only the desired channel is included between the antenna and the mixer, most of the undesired signals can be filtered out.

In the prior art television tuners, providing such tunable filters for each of the VHF channels makes the tuners more complicated and expensive, but it has heretofore been considered essential to do so in order to minimize or eliminate image interference.

SUMMARY OF THE INVENTION

It is one object of the invention to provide a tuner of relatively simpler construction than the above-described prior art tuners.

It is another object of the invention to provide a multi-band, multi-channel tuner with fixed, relatively broad-bandpass filter means and switching means between the antenna and the mixer to allow only the channels (including the desired channel) in one band at a time to reach the mixer.

According to one embodiment of the present invention, a tuner to receive signals in channels grouped into two bands has an input section comprising two filters and switching means, such as a double-throw switch, between an input terminal, usually an antenna terminal, and a mixer. Each of these filters in the input section of the tuner has a fixed, relatively broad, pass band that transmits all of the channels in one received band, but only those channels, and the switching means allows only the filter that passes the band that includes the desired channel to pass signals from the input terminal to the amplifier and on to the mixer.

In accordance with standard superheterodyne receiver practice, the tuner includes a tunable local oscillator to supply a signal to the mixer to convert the desired channel to a fixed intermediate frequency (i.f.) band. The use of input section filters with relatively broad, fixed, pass bands, each capable of passing several channels, instead of relatively narrow pass bands capable of passing only a single channel, simplifies the construction of the tuner but places some constraints on the selection of the intermediate frequency band. The constraints for a tuner in which the frequency of the local oscillator is higher than any frequency in the desired channel (but not necessarily higher than any frequency in the band that includes that channel), and which is called upper heterodyning, are different from those that apply when the local oscillator frequency is lower than any frequency in the desired channel, a condition known as lower heterodyning.

In a second embodiment, the constraints may be eased by using separate i.f. filters for the upper and lower received bands. This permits the use of upper heterodyning for signals in one band and lower heterodyning for signals in the other band.

Other objects, features, and advantages of the present invention will become apparent from the following description taken in conjunction with the accompanying drawings.

DESCRIPTION OF THE PREFERRED EMBODIMENTS

Figure 1:
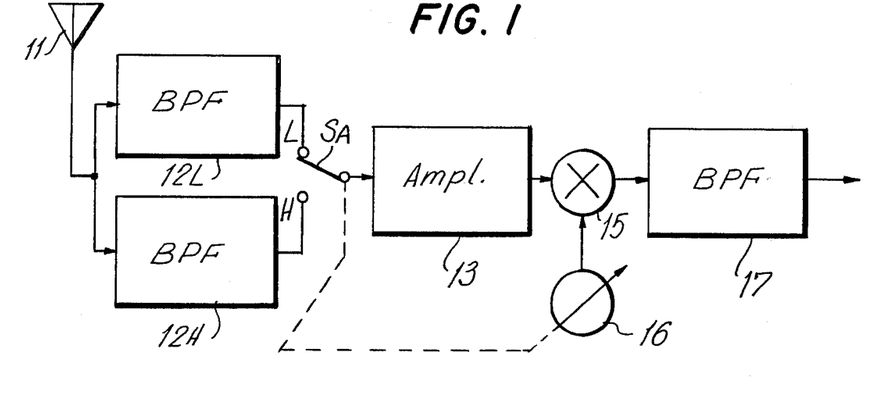
FIGS. 1 and 2 are block diagrams of two embodiments of the present invention.

In FIG. 1 an antenna 11 receives broadcast signals and connects them to a first bandpass filter 12L and to a second bandpass filter 12H. In the embodiment illustrated, the output terminals of the filters 12L and 12H are connected, respectively, to terminals L and H of a double-throw switch $S_A$. This switch and the two filters comprise an input section of a tuner.

Each of the filters has a fixed pass band, that of the filter 12H covering a range of higher frequencies than that of the filter 12L. For example, the tuner may be arranged to receive VHF television signals which are broadcast in two bands, each having several channels. In accordance with Japanese government standards, the lower band of television signals includes three channels, numbered 1 through 3 and each having a bandwidth $f_B$ of 6MHz, from a lowest frequency $f_P$ of 90MHz to a highest frequency $f_S$ of 108MHz. The same standards provide for an upper band that includes nine channels numbered 4 through 12 and each having the same bandwidth but with an overlap of 2MHz between channels 7 and 8, so that the upper band extends from a lowest frequency $f_T$ of 170MHz to a highest frequency $f_W$ of 222MHz. The filter 12L to receive the lower band has a fixed bandpass of 90MHz to 108MHz and the filter 12H has a bandpass of 170MHz to 222MHz.

The United States standards established by the Federal Communications Commission require that VHF television signals be separated into a lower band containing channels numbered 2 through 6 and each having a bandwidth $f_B$ of 6MHz and extending from a lowest frequency of $f_P$ of 54MHz to a highest frequency $f_S$ of 88MHz, and an upper band containing channels numbered 7 through 13 and extending from a lowest frequency $f_T$ of 176MHz to a highest frequency $f_W$ of 216MHz.

Although the specific frequencies in the Japanese and U.S. standards are different, the conversion principles are the same. The only channels that need to be considered in order to prevent image interference are the lowest and highest channels of the lower and upper bands. Within those four channels, only the lowest and highest frequencies need be considered, and, instead of using channel numbers, it is more convenient to designate the lowest and highest frequencies, respectively, of the lowest channel of the lower band as $f_P$ and $f_Q$ and the lowest and highest frequencies, respectively, of the highest channel of the lower band as $f_R$ and $f_S$. The lowest and highest frequencies of the lowest channel of the upper band are $f_T$ and $f_U$, respectively, and the lowest and highest frequencies of the highest channel of the upper band are $f_V$ and $f_W$, respectively.

The switch $S_A$ has an arm that can make contact with either of the fixed contacts L or H, depending on whether the user wants to receive one of the channels in the low band or one of the channels in the upper, or high, band. The arm of the switch, which is also the output terminal thereof, is connected to a high frequency amplifier circuit 13, the output of which is connected to a mixer 15. A local oscillator 16 is also connected to the mixer to supply signals to be multiplied by, or heterodyned with, signals that reach the mixer by way of the amplifier 13. The output signal of the mixer 15 is applied to a filter 17, the pass band of which is fixed and is the i.f. band of the tuner.

In order to convert the frequency of a desired channel to a fixed i.f. band, the local oscillator frequency must be set at the proper frequency. It is well known that heterodyne operation can result in undesired interference signals in the i.f. band. Customarily, the effects of these interference signals have been minimized or eliminated by providing a tunable input section having one or more filters tunable to each channel in each band and having bandpass characteristics to allow only the desired channel to pass through to the mixer while attenuating other received signals. In accordance with the present invention, the pass bands of the filters 12L and 12H are relatively broad, so that different limitations, or constraints, apply in choosing an i.f. band that will prevent image interference.

The i.f. band has a lower frequency $f_L$ and an upper frequency $f_H$. The difference between these frequencies is the i.f. bandwidth $f_B$, which, in the case of television signals, is 6MHz. The local oscillator frequencies required to convert the frequencies of the received channels to the i.f. band will be designated as $f_n$, where n corresponds to the channel number.

Figures 4, 6:
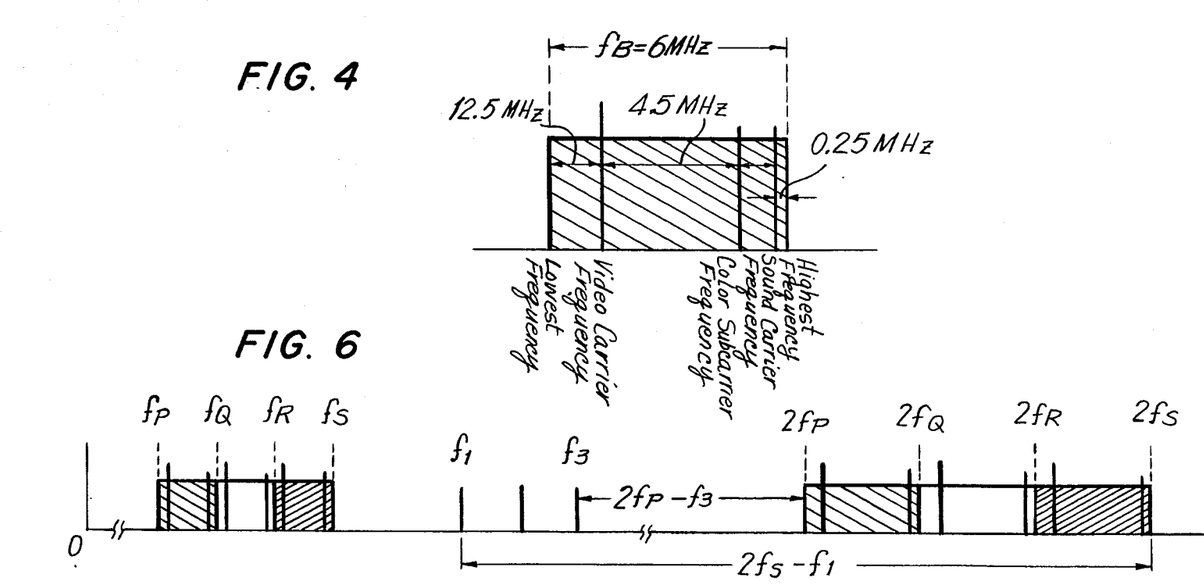
FIGS. 4 through 8 are frequency spectrum diagrams for explaining the frequency relations in the circuits in FIGS. 1 and 2.

FIG. 4 represents the frequency spectrum of a single television channel. The overall bandwidth $f_B$ is 6MHz, the video, or picture, carrier frequency is 1.25MHz above the lowest frequency, and there is a fixed frequency difference of 4.5MHz between the video and sound carrier frequencies. Therefore, the sound carrier frequency is 0.25MHz below the highest frequency of the channel. If color signals are being broadcast, there is a color subcarrier frequency, which is standard in the United States at 3.579545MHz above the video carrier frequency.

Figure 5:
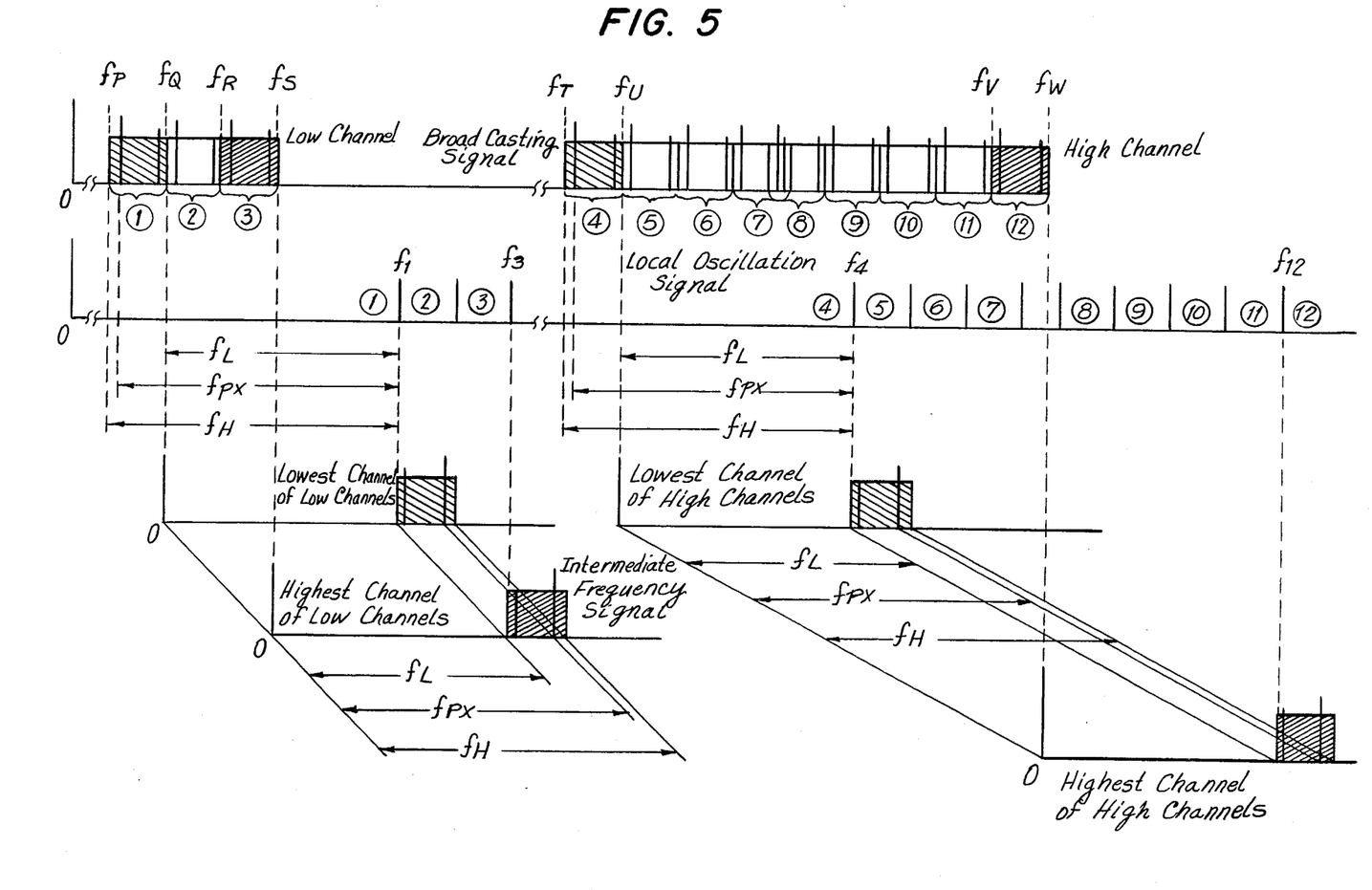
Figure 7:
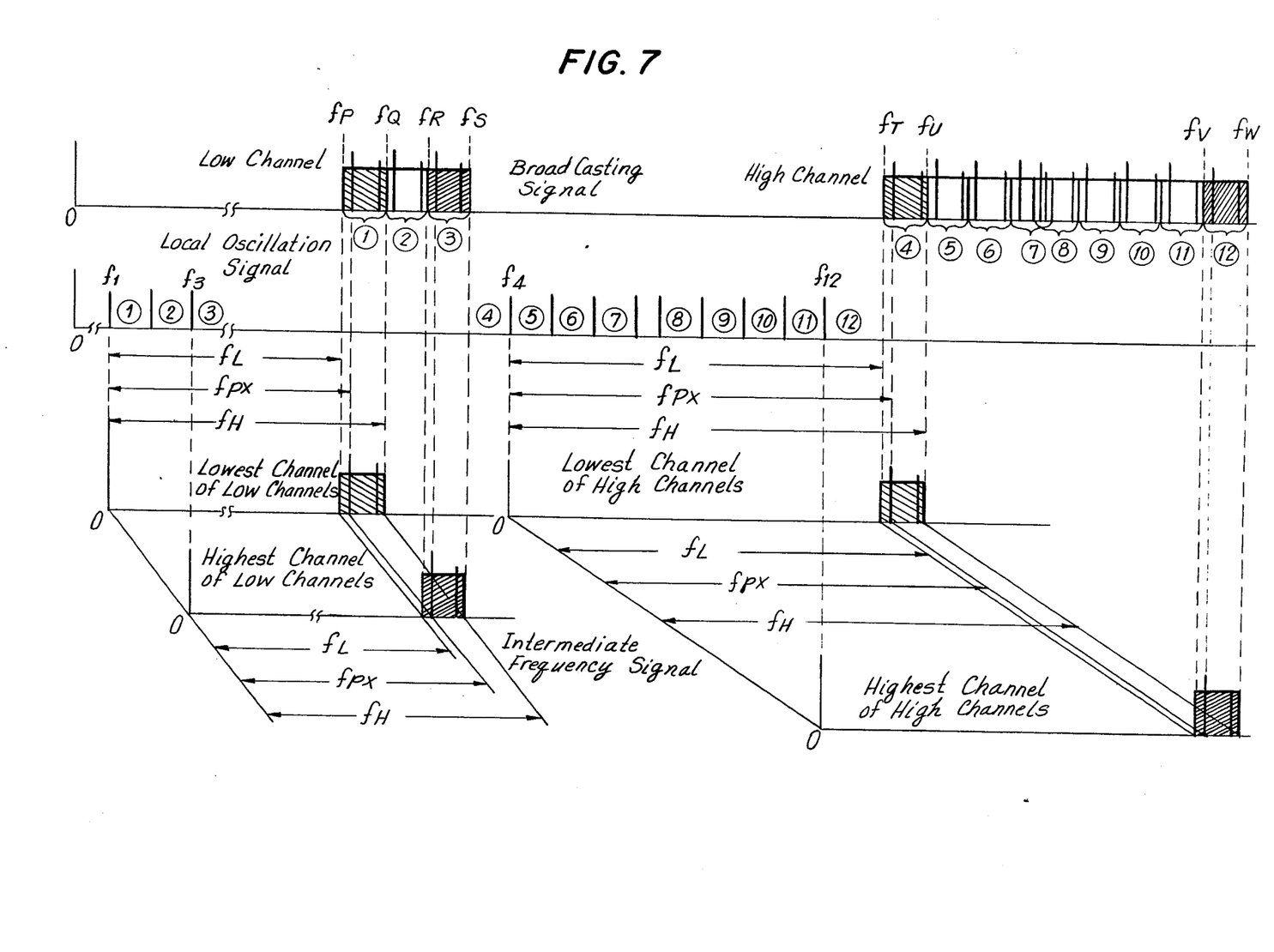
Figure 8:
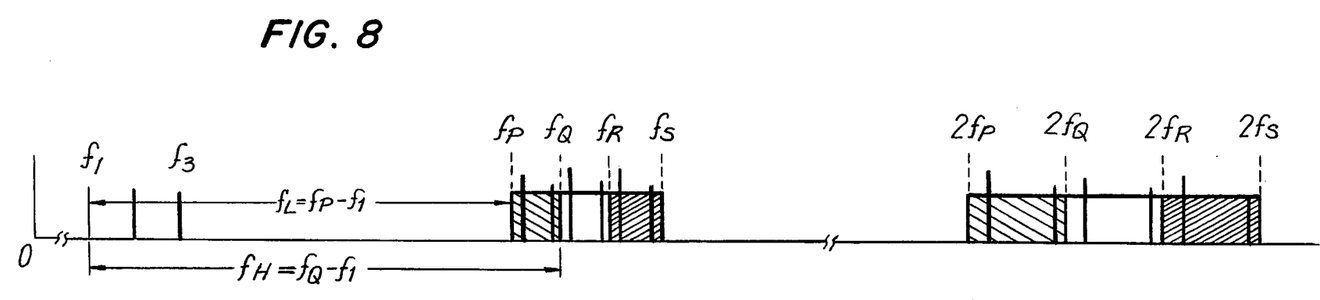

FIGS. 5 and 6 show frequency spectrum diagrams used for explaining selection of the preferred i.f. band for a frequency conversion relationship designated as an upper heterodyne system in which the local oscillator frequency $f_n$ is above the frequencies of the desired channel. From FIG. 5 it will be apparent that the lowest frequency $f_L$ in the i.f. band is equal to the difference between the local oscillator frequency for any channel and the highest frequency of that channel. In particular, FIG. shows that $f_L = f_1 - f_Q$, and if $f_L$ is greater than $(f_S - f_1)$, the following condition is true:

$$f_L > f_S - f_1 = f_S - (f_Q + f_L)$$

or, rearranging, $$2f_L > f_S - f_Q.$$

Dividing both sides by 2 gives the first condition:

$$f_L > \frac{f_S - f_Q}{2} = \frac{f_S - f_P - f_B}{2} \quad (1)$$

According to condition (1), if the switch $S_A$ is set to allow only the low band comprising channels 1-3 to reach the mixer 15, and if the frequency of the local oscillator is at a frequency $f_1$ to convert the lowest-frequency channel, no signals from the other lower band channels will be converted to the i.f. band if the lowest frequency $f_L$ in the i.f. band is higher than one-half the difference between the highest frequencies $f_S$ and $f_Q$, respectively, of the highest and lowest channels in that band. There is no need to be concerned about interference from channels in the upper band, because such signals could not pass through the filter 12L and the switch $S_A$.

The same procedure can be used to select a frequency $f_L$ based on frequencies of the channels 4–12 in the upper band. If the lowest frequency $f_L$ in the i.f. band is selected to be higher than the difference between the highest frequency of the highest channel in the upper band and the local oscillator frequency for converting the lowest channel in that band, the following condition is defined:

$$f_L > f_W - f_4.$$

Since $$f_4 = f_L + f_U,$$

this value may be substituted in the preceding inequality to give:

$$f_L > \frac{f_W - f_U}{2} = \frac{f_W - f_T - f_B}{2} \quad (2)$$

As previously stated, channels in the upper band can only be received when the arm of the switch $S_A$ connects the filter 12H to the mixer 15.

The values of $f_L$ that satisfy condition (1) are not necessarily the same as those that satisfy condition (2).

These conditions merely set lower limits to the frequency $f_L$. If, for example, the frequency limit set by condition (1) is that the frequency $f_L$ must be greater than 6MHz, while the limit set by condition (2) is that the frequency $f_L$ must be greater than 23MHz, the choice of an i.f. band that has a lower frequency of 23MHz or higher will satisfy both conditions.

Although the filter 12L prevents frequencies higher than about $f_S$ from reaching the amplifier 13, when the arm of the switch $S_A$ is in contact with the terminal L, the amplifier 13 can produce harmonics of these relatively low frequency signals. It is necessary to select the i.f. band to avoid image interference between the lower band and its harmonics, particularly its second harmonic.

FIG. 6 shows the relationship between the lower band, the local oscillator frequencies, and the second harmonics of the lower band. As always in an upper heterodyne system, the lowest frequency $f_L$ in the i.f. band is defined as the difference between the local oscillator frequency and the highest frequency in the channel converted by that local oscillator frequency. Using the Japanese frequency allocations in which the highest channel in the lower band is channel 3 and its highest frequency is $f_S$ and the local oscillator frequency that converts channel 3 to the i.f. band is therefore designated as $f_3$, the frequency $f_L$ is $$f_L = f_3 - f_S.$$

The highest frequency $f_H$ in the i.f. band is $$f_H = f_L + f_B.$$

There can be no image interference between any of the channels in the lower band and the second harmonics of those channels if the lowest second harmonic frequency $2f_P$ is greater than the sum of the local oscillator frequency for the highest channel of the lower band and the highest i.f. frequency $f_H$. Or, stated symbolically, $$2f_P > f_3 + f_H$$

By substituting $f_S + f_L$ for $f_3$ and $f_L + f_B$ for $f_H$, $$2f_P > f_S + f_L + f_L + f_B$$

or, rearranging to obtain the necessary value of $f_L$, $$f_L < \frac{2f_P - f_S - f_B}{2} \tag{3A}$$

Alternatively, if the image frequency of the lowest channel in the lower band were higher than the highest second harmonic frequency $2f_S$, no image interference could occur. The image frequency of the lowest channel, which lies between $f_P$ and $f_Q$, is in the band between $f_Q + 2f_L$ and $f_Q + 2f_L + f_B$. Since $f_Q + 2f_L$ is a lower frequency than $f_Q + 2f_L + f_B$, the requirement for avoiding interference will be achieved if $$2f_S < f_Q + 2f_L$$

This inequality may be rearranged to show $$2f_L > 2f_S - f_Q$$

or, by substituting the equivalent value $f_P + f_B$ for $f_Q$ and dividing the result by 2, this inequality becomes $$f_L > \frac{2f_S - f_P - f_B}{2} \tag{3B}$$

The same procedure can be used to obtain corresponding alternative conditions for the upper band:

$$f_L < \frac{2f_T - f_W - f_B}{2} = \frac{2f_T - f_V}{2} \tag{4A}$$

or $$f_L > \frac{2f_W - f_T - f_B}{2} = \frac{2f_W - f_U}{2} \tag{4B}$$

In the case of the lower heterodyne system the local oscillator signal is lower in frequency than the lowest frequency of the channel signal to be detected by the use of that local oscillator frequency. By making all of the local oscillator signals that are to be mixed with the lower band signals lower than the lowest frequency $f_P$ in that band, interference between any two channels in the lower band will be avoided. Moreover, if such a local oscillator signal from one receiver is radiated to another receiver, it will not pass through the input filter of the second receiver and thus will not cause interference in the second receiver.

The same thing is true of the local oscillator signal selected to be mixed with signals in the upper band. Thus, even the local oscillator signal that is intended to be mixed with the highest frequency channel in the upper band should be lower in frequency than the lowest frequency $f_T$ of the lowest channel in the upper band.

Finally, all of the local oscillator signals to be used in detecting the upper band channels should have frequencies higher than the highest frequency of the lower band and lower than the lowest frequency of the upper band.

These conditions will be satisfied for the Japanese frequency allocations if:

$$f_P > f_3 = f_R - f_L,$$

which can be rearranged to state:

$$f_L > f_R - f_P = f_S - f_B - f_P, \tag{5A}$$

and $$f_T > f_{12} = f_V - f_L,$$

which can be rearranged to state:

$$f_L > f_V - f_T = f_W - f_B - f_T, \tag{5B}$$

and $$f_S < f_4 = f_T - f_L,$$

which can be rearranged to state:

$$f_L < f_T - f_S \tag{5C}$$

The corresponding conditions for U.S. frequency allocations use the same symbols since the local oscillator frequencies, which would be written $f_6$, $f_{13}$, and $f_7$, do not appear in conditions 5A – 5C.

By selecting the i.f. band so that all of the local oscillator signals, whether for the lower band or the upper band, are below the respective band, there can be no image interference between any two channels in either band. The relatively wideband, fixed filters 12L and 12H prevent any image interference between any channel in either of the two received bands and any channel in the other of the two bands.

However, the filters 12L and 12H have no effect on second harmonic distortion produced in the amplifier 13 that follows the filters. When the arm of the switch $S_A$ is set to the terminal L to allow only the lower band signals to reach the amplifier 13, one way to avoid second harmonic interference is to select the i.f. band so that its lowest frequency $f_L$ is higher than the local oscillator frequency required to convert the highest channel in the lower band to that i.f. band. Mathematically, this may be stated (for Japanese allocations):

$$f_L > f_3$$

Since $f_3 = f_R - f_L$, the preceding inequality may be rewritten as:

$$f_L > f_R - f_L$$

or, rearranging, $$f_L > f_R/2 = (f_S - f_B)/2 \qquad (6A)$$

Condition 6A also applies to U.S. frequency allocations, since the symbol $f_S$ is defined as the lowest frequency in the highest channel in the lower band and is not defined by number.

Alternatively, interference from second harmonics can be achieved, when the arm of the switch is set to the terminal L, by selecting the i.f. band so that the highest frequency $f_H$ of that band is lower than the difference between the local oscillator frequency for the lowest channel and the total bandwidth of the lower band. The bandwidth of the lower band is the difference between the highest and lowest frequencies $f_S$ and $f_P$ of the lower band. Mathematically, using the designations for the Japanese frequency allocations, this is:

$$f_H < f_1 - (f_S - f_P)$$

The frequency $f_1$ is, by definition, equal to $(f_p - f_L)$, which may be substituted for $f_1$ to change the immediately preceding inequality to:

$$f_H < f_P - f_L - f_S + f_P$$

or, substituting $f_L + f_B$ for $f_H$ in order to state the condition in terms of $f_L$ rather than $f_H$, and collecting terms:

$$f_L < \frac{2f_P - f_S - f_B}{2} \qquad (6B)$$

As in the case of condition 6A, condition 6B is also directly applicable to the U.S. frequency allocations.

Conditions 6A and 6B define alternative choices of i.f. band frequencies for avoidance of second harmonic interference in receiving the lower band. Corresponding conditions can be obtained for the upper band by selecting the i.f. band so that either the lowest intermediate frequency $f_L$ is higher than the local oscillator frequency required to convert the lowest channel of the upper band, or the highest intermediate frequency $f_H$ is lower than the difference between the local oscillator frequency required to convert the lowest channel of the upper band and the total bandwidth of the upper band. By mathematical manipulations that correspond exactly to those used to obtain conditions 6A and 6B, the following alternative conditions can be derived:

$$f_L > \frac{f_V}{2} = \frac{f_W - f_B}{2} \qquad (7A)$$

or $$f_L < \frac{2f_T - f_W - f_B}{2} \qquad (7B)$$

The frequencies of the respective VHF television channel signals in Japan are shown in the following Table I, where $f_B = 6$MHz and the video and sound carriers have the relationships described in connection with FIG. 3.

Table I

| | Lowest Frequency (MHz) | Video Carrier Frequency (MHz) | Sound Carrier Frequency (MHz) | Highest Frequency (MHz) |
|---|---|---|---|---|
| Lower Band Channel Nos. | | | | |
| 1 | 90 (=$f_P$) | 91.25 | 95.75 | 96 (=$f_Q$) |
| 2 | 96 | 97.25 | 101.75 | 102 |
| 3 | 102 (=$f_R$) | 103.25 | 107.75 | 108 (=$f_S$) |
| Upper Band Channel Nos. | | | | |
| 4 | 170 (=$f_T$) | 171.25 | 175.75 | 176 (=$f_U$) |
| 5 | 176 | 177.25 | 181.75 | 182 |
| 6 | 182 | 183.25 | 187.75 | 188 |
| 7 | 188 | 189.25 | 193.75 | 194 |
| 8 | 192 | 193.25 | 197.75 | 198 |
| 9 | 198 | 199.25 | 203.75 | 204 |
| 10 | 204 | 205.25 | 209.75 | 210 |
| 11 | 210 | 211.25 | 215.75 | 216 |
| 12 | 216 (=$f_V$) | 217.25 | 221.75 | 222 (=$f_W$) |

Table II lists only the frequencies $f_P$ through $f_W$ as allocated in the United States. It is unnecessary to list other frequencies since these four are the only ones that enter into the computations.

Table II

| Channel 2 | $f_P = 54$MHz | $f_Q = 60$MHz | |
|---|---|---|---|
| | | | Lower Band |
| Channel 6 | $f_R = 82$MHz | $f_S = 88$MHz | |
| Channel 7 | $f_T = 174$MHz | $f_U = 180$MHz | |
| | | | Upper Band |
| Channel 13 | $f_V = 210$MHz | $f_W = 216$MHz | |

Applying the values listed in Table I to determine the proper value for $f_L$ in Japan, condition (1) gives the following condition:

$$f_L > (f_S - f_Q)/2 = 6\text{MHz} \qquad (8)$$

Condition (2) gives the following condition:

$$f_L > (f_W - f_U)/2 = 23\text{MHz} \qquad (9)$$

The alternative conditions (3A) and (3B) give the following conditions:

$$f_L < \frac{2f_P - f_S - f_B}{2} = 33\text{MHz} \qquad (10A)$$

or $$f_L > \frac{2f_S - f_P - f_B}{2} = 60\text{MHz} \qquad (10B)$$

The alternative conditions (4A) and (4B) give the following conditions:

$$f_L < \frac{2f_T - f_W - f_B}{2} = 56\text{MHz} \quad (11\text{A})$$

or $$f_l > \frac{2f_W - f_U}{2} = \frac{2f_W - f_T - f_B}{2} \quad 134\text{MHz} \quad (11\text{B})$$

Accordingly, the following alternative will satisfy the conditions (8), (9), (10A), and (11A)

$$23\text{MHz} < f_L < 33\text{MHz} \quad (12\text{A})$$

Alternatively, the condition that will satisfy conditions (8), (9), (10B), and (11B)

$$f_L > 134\text{MHz} \quad (12\text{B})$$

If the video intermediate frequency is taken as $f_{px} = f_L + 4.75\text{MHz}$, it is enough that $f_{px}$ satisfies one of the following alternatives which correspond to conditions (12A) and (12B):

$$27.75\text{MHz} < f_{px} < 37.75\text{MHz} \quad (13\text{A})$$

$$f_{px} > 138.75\text{MHz} \quad (13\text{B})$$

Applying conditions (1), (2), (3A), (3B), (4A), and (4B) to the U.S. frequency allocation for VHF television, as listed in Table II, gives:

$$f_L > \frac{f_S - f_Q}{2} = \frac{88 - 60}{2} = 14\text{MHz} \quad (14)$$

and $$f_L > \frac{f_W - f_U}{2} = \frac{216 - 180}{2} = 18\text{MHz} \quad (15)$$

and either $$f_L < \frac{2f_P - f_S - f_B}{2} = \frac{108 = 88 - 6}{2} = 7\text{MHz} \quad (16\text{A})$$

or $$f_L > \frac{2f_S - f_P - f_B}{2} = \frac{176 - 54 - 6}{2} = 58\text{MHz} \quad (16\text{B})$$

and either $$f_L < \frac{2f_T - f_W - f_B}{2} = \frac{348 - 216 - 6}{2} = 63\text{MHz} \quad (17\text{A})$$

$$f_L > \frac{2f_W - f_U}{2} = \frac{432 - 180}{2} = 126 \text{ MHz} \quad (17\text{B})$$

Any frequency $f_L$ that is greater than 14MHz cannot also be less than 7MHz, so the alternative represented by condition 16A is not compatible with condition 14 or condition 15 in the United States. Therefore, it is necessary to select the alternative condition 16B, since any frequency $f_L$ greater than 58 MHz will also be greater than 18MHz and 14MHz. Conditions (14), (15), and (16B) could be combined with condition (17A), but $f_L$ would then have to be between 58MHz and 63MHz, which would cause the i.f. band to overlap channels 2 and 3. That would not be acceptable. The lowest intermediate frequency $f_L$ would not only have to be above 58MHz but above 88MHz to avoid overlapping any lower band channels. The latter requirement could also be met by combining conditions (14), (15), and (16B) with conditions (17B). In that case, the lowest intermediate frequency $f_L$ would then have to be greater than 126 MHz, which would allow the i.f. band to be between the lower and upper received bands.

Next, the case of the lower heterodyne system will be considered.

From the conditions (5A)–(5C) the following conditions (18A)–(18C) are derived for the Japanese frequency allocations.

$$f_L > f_R - f_P = 12\text{MHz} \quad (18\text{A})$$

$$f_L > f_V - f_T = 46\text{MHz} \quad (18\text{B})$$

$$f_L < f_T - f_S = 62\text{MHz} \quad (18\text{C})$$

From the condition (6A) the following condition (19A) is derived.

$$f_L > f_R/2 = 51\text{MHz} \quad (19\text{A})$$

and from the condition (6B) the following condition (19B) is derived $$f_L < \frac{2f_P - f_S - f_B}{2} = 33\text{MHz} \quad (19\text{B})$$

The following alternative conditions (20A) and (20A) are derived from conditions (7A) and (7B):

$$f_L > f_V/2 = 108\text{MHz} \quad (20\text{A})$$

and $$f_L < \frac{2f_T - f_W - f_B}{2} = 56\text{MHz} \quad (20\text{B})$$

Accordingly, the following condition (21) satisfies all the conditions (18A) through (20B).

$$51\text{MHz} < f_L < 56\text{MHz} \quad (21)$$

If the video intermediate frequency $f_{px}$ is considered, $f_{px}$ will satisfy the following condition (22) since $f_{px} = f_L + 1.25\text{MHz}$.

$$52.25\text{MHz} < f_{px} < 57.25\text{MHz} \quad (22)$$

Applying conditions (5A)–(5C) to United States frequency allocations results in the following:

$$f_L > f_R - f_P = 28\text{MHz} \quad (23\text{A})$$

$$f_L > f_V - f_T = 36\text{MHz} \quad (23\text{B})$$

$$f_L < f_T - f_S = 86\text{MHz} \quad (23\text{C})$$

Alternative conditions (6A) and (6B) yield $$f_L > f_R/2 = 41\text{MHz} \quad (24\text{A})$$

and $$f_L < \frac{2f_P - f_S - f_B}{2} = 7\text{MHz} \quad (24\text{B})$$

while the other alternative conditions (7A) and (7B) yield:

$$f_L > f_V/2 = 105\text{MHz} \quad (25\text{A})$$

and $$f_L < \frac{2f_T - f_W - f_B}{2} = 63 \text{MHz} \quad (25B)$$

The conditions (23A) and (23B) and the alternative condition (24A) are consistent with each other, because any frequency $f_L$ that is greater than 41MHz is also greater than 36MHz or 28MHz. Similarly, condition (23C) is consistent with the alternative condition (25B), because any frequency $f_L$ lower than 63 MHz is also lower than 86MHz. Thus, the lower intermediate frequency must be:

$$41 \text{MHz} < f_L < 63 \text{MHz} \quad (26)$$

In order for the 6MHz i.f. band to be entirely below channel 2, which starts at 54MHz, $f_L$ should be below 48MHz.

Figure 2:
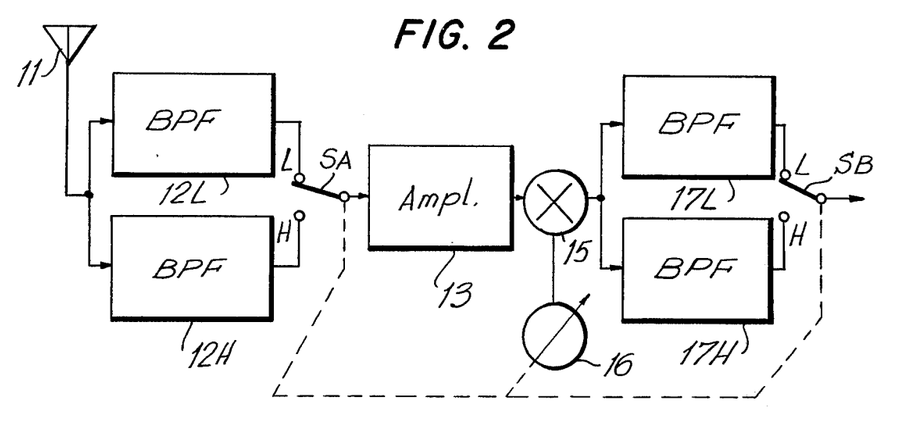

It is possible for the low and high bands to be converted by different heterodyne systems. FIG. 2 is a block diagram of an embodiment of the invention arranged for just such a case. When the low channels in the lower band are received, the upper heterodyne system may be used, while when the channels in the upper band are received, the lower heterodyne system may be used, or vice versa. For example, the lowest intermediate frequency $f_L$ can be selected so that it satisfies the conditions (1) through (4B) and that the lowest frequency $f_L$ of the i.f. signal upon the reception of high channels satisfies $f_L > f_R - f_P$ of the condition (5A) and satisfies the conditions (7A) and (7B). Alternatively, the lowest frequency $f_L$ of the i.f. signal upon reception of upper band may be selected so that it satisfies the conditions (2) and (4A) and (4B) which are sufficient. Accordingly, in this case since the band of the intermediate frequency signals is different for the reception of the lower and higher bands, one i.f. filter 17L may be provided for reception of channels in the lower band and a separate i.f. filter for channels in the higher band. The output signals from the filters 17L and 17H are connected to a double-throw switch $S_B$, which is ganged with the switch $S_A$ so as to deliver the i.f. signals, as shown in FIG. 2.

Figure 3:
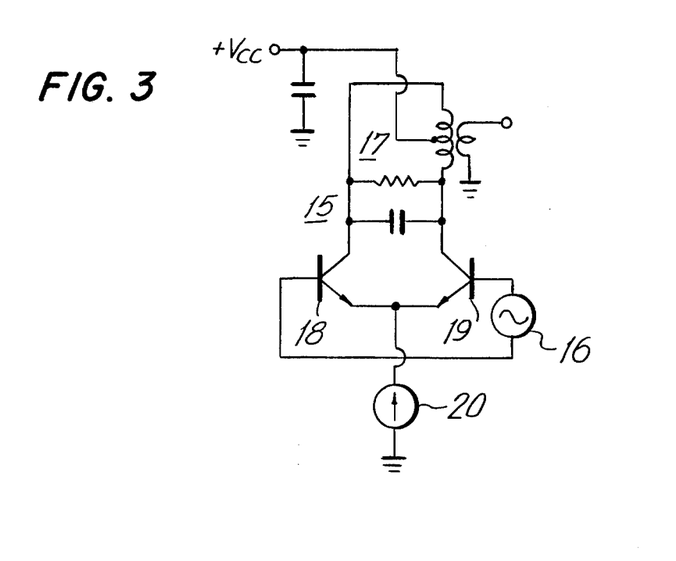
FIG. 3 is a schematic diagram of a mixer suitable for use in the circuits shown in FIGS. 1 and 2.

FIG. 3 shows a circuit for the mixer 15 formed of two transistors 18 and 19 connected differentially. A current source 20 connected to the emitters of both the transistors 18 and 19 converts the output signal from the high frequency amplifier 13 to a currrent, the local oscillator 16 is connected between the bases of the transistors 18 and 19, and the band pass filter 17 for the intermediate frequency signal is connected to the collectors of the transistors 18 and 19 so that the secondary distortion components are cancelled. As a result, no secondary distortion components are delivered through the band pass filter 17.

As described above, according to the present invention, even without the provision of a separate frequency selection filter circuit for every channel, image frequency interference caused by other channel signals is prevented and the occurrence of unnecessary signals caused by the second harmonics is avoided. Thus, the tuner of the invention can receive a selected channel signal and yet the tuner has very simple construction.

When the lower heterodyne system is used, the band of broadcasting signals and the band of the local oscillator signal can be also separated in this invention, so that even if there is leakage of the local oscillator signal, the leaked signal does not act as a jamming signal for other receivers located nearby.

It will be apparent that many modifications and variations could be effected by one skilled in the art without departing from the spirit or scope of the novel concepts of the present invention.

What is claimed is:

1. A tuner for receiving a selected channel of a group of channels divided into a lower band comprising a plurality of lower band channels and a higher band comprising a plurality of higher band channels, said tuner comprising:

first filter means having a fixed pass band tuned to pass said lower band;

second filter means having a fixed pass band tuned to pass said higher band;

switching means connected to said first and second filter means to provide a signal path through a selective one of said first and second filter means;

a mixer connected to said signal path to receive the output signal thereof;

a local oscillator connected to said mixer to supply thereto a frequency-converting signal to convert the frequency of said selected channel to an intermediate frequency band having a lowest frequency $f_L$ determined by the following conditions when the frequency of the frequency-converting signal is higher than the highest frequency of a selected channel:

$$f_L > \frac{f_S - f_P - f_B}{2}$$

and $$f_L > \frac{f_W - f_T - f_B}{2}$$

and one of the following:

$$f_L < \frac{2f_P - f_S - f_B}{2}$$

or $$f_L > \frac{2f_S - f_P - f_B}{2},$$

and one of the following:

$$f_L < \frac{2f_T - f_W - f_B}{2}$$

or $$f_L > \frac{2f_W - f_T - f_B}{2},$$

and the lowest frequency $f_L$ in the intermediate frequency band is determined by the following conditions when the frequency of the frequency-converting signal is lower than the lowest frequency of a selected channel:

$$f_L > f_S - f_B - f_P$$

and $$f_L < f_T - f_S$$

and $$f_L > f_W - f_B - f_T$$

and one of the following:

$$f_L > \frac{f_S - f_B}{2}$$

or $$f_L < \frac{2f_P - f_S - f_B}{2}$$

and one of the following:

$$f_L > \frac{F_W - f_B}{2}$$

or $$f_L < \frac{2f_T - f_W - f_B}{2}$$

where:
$f_B$ is the bandwidth of each channel,
$f_P$ is the lower frequency in the lower band,
$f_S$ is the higher frequency in the lowest band,
$f_T$ is the lowest frequency in the highest band, and
$f_W$ is the highest frequency in the higher band.

2. A tuner as claimed in claim 1 comprising high frequency amplifier means connected in cascade between said first and second filter means and said mixer.

3. A tuner as claimed in claim 2 in which said switching means is connected to output terminals of each of said first and second filter means and comprises an output terminal connected to said high frequency amplifier means to supply to said amplifier means, selectively, either lower band signals that pass through said first filter means or higher band signals that pass through said second filter means.

4. A tuner as claimed in claim 1 further comprising two intermediate frequency filters connected in parallel to the output of said mixer.

5. A tuner as claimed in claim 4 comprising a second switch means changeably connected to output sides of said two intermediate frequency filters.

6. A tuner as claimed in claim 1 in which said first filter has a pass band with a lowest frequency of about 54MHz and a highest frequency of about 88MHz, and said second filter has a pass band with a lowest frequency of about 174MHz and a highest frequency of about 216MHz, and $f_L$ is greater than 88MHz.

7. A tuner as claimed in claim 6 comprising an intermediate frequency band filter connected to said mixer and having a pass band not substantially greater in width than $f_B$ and having an upper pass band frequency less than 108MHz.

* * * * *